US008468692B2

United States Patent
Kim

(10) Patent No.: US 8,468,692 B2
(45) Date of Patent: Jun. 25, 2013

(54) METHOD OF MANUFACTURING A VARIABLE RESISTANCE MEMORY DEVICE

(75) Inventor: Byeung Chul Kim, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 83 days.

(21) Appl. No.: 13/252,250

(22) Filed: Oct. 4, 2011

(65) Prior Publication Data

US 2012/0117801 A1    May 17, 2012

(30) Foreign Application Priority Data

Nov. 17, 2010    (KR) .......................... 10-2010-0114542

(51) Int. Cl.
*H05K 3/02*    (2006.01)
*H05K 3/10*    (2006.01)

(52) U.S. Cl.
USPC .... 29/846; 29/603.07; 29/603.13; 29/603.14; 29/603.16; 29/603.18; 257/E27.004; 257/E27.073; 257/E29.33; 257/295; 365/158; 365/163; 438/95; 438/129

(58) Field of Classification Search
USPC ......... 29/603.13–603.16, 603.18, 846; 257/4, 257/5, E27.004, E27.073, E29.33, 295; 365/158, 163; 438/95, 129
See application file for complete search history.

(56) References Cited

U.S. PATENT DOCUMENTS

| | | | |
|---|---|---|---|
| 6,649,928 B2 | 11/2003 | Dennison | |
| 7,910,908 B2* | 3/2011 | Chang | 257/4 |
| 8,168,479 B2* | 5/2012 | Ha | 438/129 |
| 8,293,650 B2* | 10/2012 | Chang | 438/689 |
| 2004/0058495 A1* | 3/2004 | Yoon et al. | 438/257 |
| 2008/0191188 A1* | 8/2008 | Jeong | 257/4 |
| 2009/0001450 A1* | 1/2009 | Kim et al. | 257/324 |

FOREIGN PATENT DOCUMENTS

| | | |
|---|---|---|
| KR | 1020060002134 A | 1/2006 |
| KR | 1020090103564 A | 10/2009 |
| KR | 1020090113669 | 11/2009 |

* cited by examiner

*Primary Examiner* — Paul D Kim
(74) *Attorney, Agent, or Firm* — Volentine & Whitt, PLLC

(57) ABSTRACT

A variable resistance memory device has memory cells that are operated by Joule's heat and which are highly thermally efficient. Conductive patterns are formed on a substrate; sacrificial patterns exposing a portion of the top surface of each of the conductive patterns are formed on the conductive patterns, lower electrodes are formed by etching upper portions of the conductive patterns using the sacrificial patterns as an etching mask, then mold patterns are formed on the lower electrodes and cover exposed sidewall surfaces of the sacrificial patterns, and then the sacrificial patterns are replaced with variable resistance patterns.

13 Claims, 15 Drawing Sheets

METHOD OF MANUFACTURING A VARIABLE RESISTANCE MEMORY DEVICE

PRIORITY STATEMENT

This U.S. non-provisional patent application claims priority under 35 U.S.C. §119 of Korean Patent Application No. 10-2010-0114542, filed on Nov. 17, 2010 and the contents of which are hereby incorporated in their entirety.

BACKGROUND

The inventive concept relates to semiconductor devices. More particularly, the inventive concept relates to variable resistance memory devices and to methods of manufacturing the same.

Semiconductor devices may be classified as memory devices or logic devices. Memory devices store data. Generally, semiconductor memory devices may be classified as volatile memory devices or nonvolatile memory devices. Volatile memory devices lose their stored data when the power supplied thereto is interrupted. Volatile memory devices include dynamic random access memory (DRAM) devices, and static random access memory (SRAM) devices. On the other hand, nonvolatile memory devices retain their stored data even when the power supplied thereto is interrupted. Nonvolatile memory devices include programmable read only memory (PROM) devices, erasable PROMs, electrically erasable PROMs (EPROMs), and flash memory devices.

Also, next generation semiconductor memory devices such as ferroelectric RAMs (FRAMs), magnetic RAMs (MRAMs), and phase change RAMs (PRAM), are being developed to offer higher performance while consuming lower amounts of power. Characteristically, materials constituting those next generation semiconductor memory devices have different resistance values depending on the values of the current and voltage supplied thereto, and maintain their resistance values even when the current or voltage supply is interrupted.

SUMMARY

According to one aspect of the inventive concept, there is provided a method of manufacturing a variable resistance memory device which includes forming conductive patterns on a substrate, forming sacrificial patterns which expose a portion only of the top surface of each of the conductive patterns, etching the conductive patterns using the sacrificial patterns as an etching mask to remove part of the upper portion of each of the conductive patterns and thereby form lower electrodes, forming mold patterns on the lower electrodes and which cover sidewalls of the sacrificial patterns, and replacing the sacrificial patterns with patterns having variable resistance.

According to another aspect of the inventive concept, there is provided a variable resistance memory device, comprising: a substrate, lower electrodes disposed on the substrate, patterns having variable resistance disposed on the lower electrodes and in contact therewith, and upper electrodes disposed on the variable resistance patterns, and in which each of the lower electrodes has at least first and second upwardly facing surfaces located at different heights in the device, and sidewall surfaces terminating at the first upwardly facing surface, in which the first upwardly facing surface of each of the lower electrodes is the top surface of the lower electrode and contacts the variable resistance pattern disposed thereon, and in which at least one of the sidewall surfaces of each of the lower electrodes is aligned with a sidewall surface of the variable resistance pattern disposed thereon.

According to still another aspect of the inventive concept, there is provided a method of manufacturing a variable resistance memory device, which includes forming preliminary conductive patterns on a substrate, removing only one part of an upper portion of each of the preliminary conductive patterns and leaving another part of the upper portion of each of the preliminary conductive patterns to thereby form lower electrodes, and forming patterns of material, whose resistance varies depending on temperature, on and in contact with top surfaces of the lower electrodes.

BRIEF DESCRIPTION OF THE DRAWINGS

The foregoing and other features and advantages of the inventive concept will be more apparent from the detailed description of the preferred embodiments thereof that follows, as made with reference to the accompanying drawings.

DETAILED DESCRIPTION OF THE PREFERRED EMBODIMENTS

Figure 1:
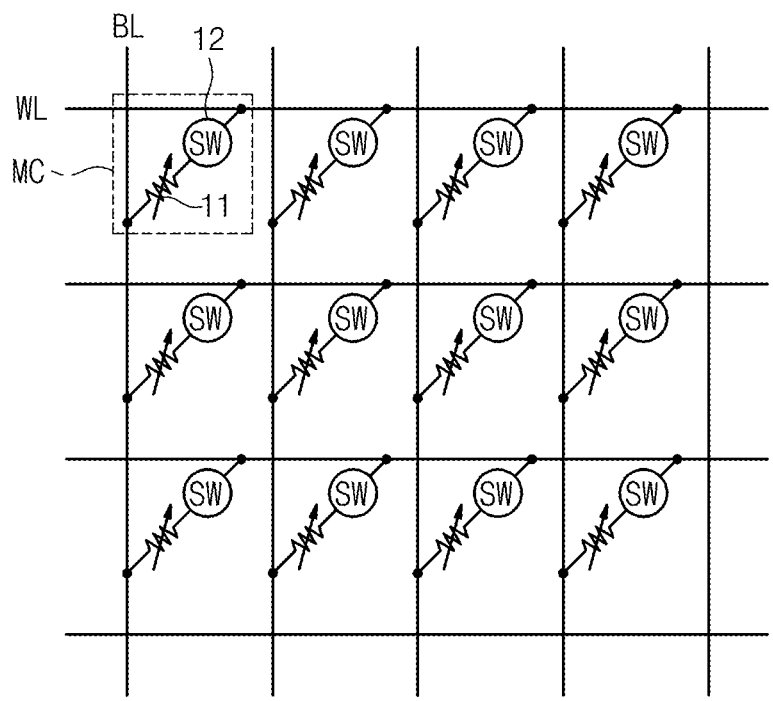
FIG. 1 is a circuit diagram of a circuit having a variable resistance memory device in accordance with the inventive concept.

Various embodiments and examples of embodiments of the inventive concept will be described more fully hereinafter with reference to the accompanying drawings. In the drawings, the sizes and relative sizes and shapes of elements, layers and regions shown in section may be exaggerated for clarity. In particular, the cross-sectional illustrations of the semiconductor devices and intermediate structures fabricated during the course of their manufacture are schematic. Also, like numerals are used to designate like elements throughout the drawings.

Furthermore, spatially relative terms, such as "upper," and "lower" are used to describe an element's and/or feature's relationship to another element(s) and/or feature(s) as illustrated in the figures. Thus, the spatially relative terms may apply to orientations in use which differ from the orientation depicted in the figures. Obviously, though, all such spatially relative terms refer to the orientation shown in the drawings for ease of description and are not necessarily limiting as embodiments according to the inventive concept can assume orientations different than those illustrated in the drawings when in use. In addition, the terms "top" and "bottom" as used to describe a surface generally refer not only to the orientation depicted in the drawings but to the fact that the feature so described is the uppermost or bottommost feature in the orientation depicted, as would be clear from the drawings and context of the written description.

It will also be understood that when an element or layer is referred to as being "on" another element or layer, it can be directly on the other element or layer or intervening elements or layers may be present. In contrast, when an element or layer is referred to as being "directly on" or in "contact" with another element or layer, there are no intervening elements or layers present.

Other terminology used herein for the purpose of describing particular examples or embodiments of the inventive concept is to be taken in context. For example, the terms "comprises" or "comprising" when used in this specification specifies the presence of stated features or processes but does not preclude the presence or additional features or processes.

Semiconductor devices in accordance with the inventive concept and methods of manufacturing the same will now be described in detail with reference to the accompanying drawings.

First, though, an example of a circuit employing a variable resistance memory device in accordance with the inventive concept will be described with reference to FIG. 1.

In this circuit, a plurality of memory cells MC are arranged in a matrix. The memory cells MC include a variable resistance device 11 and a select device 12. The variable resistance device 11 and the select device 12 are interposed between a bit line BL and a word line WL. In this respect, the select device 12 is disposed between the variable resistance device 11 and the word line WL and connects the variable resistance device 11 and the word line WL. The select device 12 is operative to control the current being supplied to the variable resistance device 11 based on the voltage of the word line WL. To this end, the select device 12 may be a diode, a MOS transistor or a bipolar transistor.

A state of the variable resistance device 11 is dependent on the magnitude of current supplied through the bit line BL. In the description of the embodiments of a variable memory device that follows, the variable resistance device 11 is described as a phase change memory device but the inventive concept is not so limited. That is, the variable resistance device may be constituted by a type of variable resistor other than a phase change variable resistor.

However, for background, the principle of operation of a variable resistance device employing phase change material will now be described. Phase change material can have an amorphous state having a relatively high resistance and a crystalline state having a relatively low resistance depending on its temperature. The amorphous state provides a set state and the crystalline state provides a reset state in a circuit or transistor that employs the phase change material. The temperature of the phase change material can be adjusted by Joule's heat produced by a lower electrode on which the phase change material is provided. And, the amount of the Joule's heat produced by such a lower electrode is dependent on the quantity of current supplied through the lower electrode and the duration of the supplying of the current. Thus, the resistivity of the phase change material is proportional to the magnitude of the current supplied to the lower electrode and the period of time during which the current is supplied.

A cell array of a variable resistance memory device, and a method of fabricating the same, in accordance with the inventive concept will now be described with reference to FIGS. 2 through 8.

Figure 2:
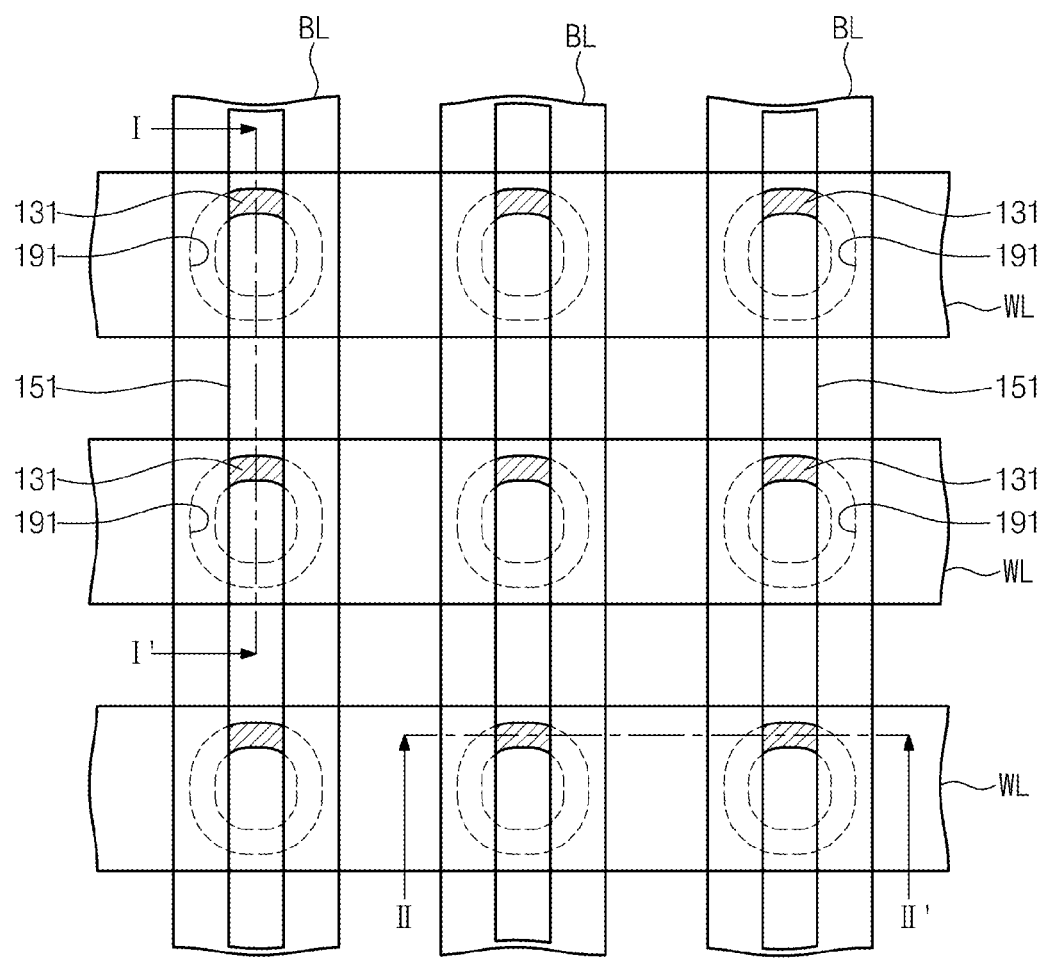
FIG. 2 is a plan view of a cell array of a first embodiment of a variable resistance memory device in accordance with the inventive concept.
Figure 3:
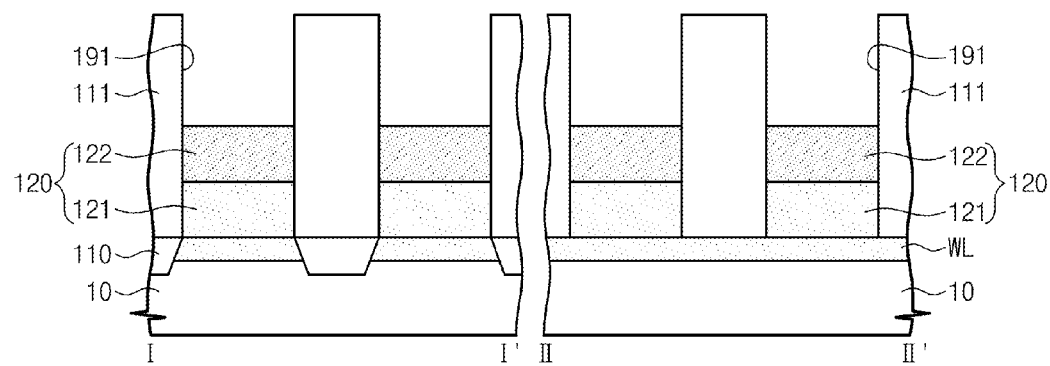
FIGS. 3 through 8 are cross-sectional views, each take in the direction of lines I-I' and II-II' of FIG. 2, and together illustrate a first embodiment of a method of manufacturing a variable resistance memory device according to the inventive concept.

Referring first to FIGS. 2 and 3, a device isolation film 110 defining an active region is formed in a substrate 10. The substrate 10 may be a semiconductor-based structure such as a silicon, silicon on insulator, silicon germanium (SiGe), germanium (Ge) or gallium arsenide (GaAs) substrate. In one example, the substrate 10 is doped with a first type impurity. For instance, the substrate 10 may be a p-type silicon substrate doped with a low concentration p-type impurity. The device isolation film 110 may be formed by a shallow trench isolation (STI) technique known in the art per se. As an example, the device isolation film 110 is a silicon oxide film formed by a high density plasma chemical vapor deposition method so as to have a superior gap-filling characteristic.

Furthermore, word lines WL are formed on the substrate 10. The word lines WL may be formed by implanting an impurity into the active region of the substrate 10. For example, in the case in which the substrate 10 is a p-type silicon substrate, the word lines WL may be formed by implanting an n-type impurity. Alternatively, the word lines WL may be formed by forming a plurality of epitaxial semiconductor layers parallel to one another on the substrate 10 and then implanting an impurity into the epitaxial semiconductor layers or by simultaneously carrying out doping and epitaxial layer forming processes. As another example, the word lines WL may be formed by forming a thin metal film on the substrate and then patterning the film.

Next, a first interlayer insulating film 111, having openings 191 exposing a top surface of the substrate 10, is formed on the substrate 10. The first interlayer insulating film 111 may be an oxide film. The openings 191 may be arrayed two-dimensionally on the substrate 10. A select device may be provided in the lower portion of each of the openings 191. As an example, the select device is a diode 120. In this example, too, the diode 120 has a first impurity region 121, and a second impurity region 122 of a different conductivity type than the first impurity region 121. For instance, the first impurity region 121 has an n-type conductivity and the second impurity region 122 has a p-type conductivity.

The diodes 120 may be formed by forming an epitaxial growth layer in the openings 191 and then performing an etch-back process. Then, ions are implanted in the epitaxial growth layer. Alternatively, the diodes 120 may be formed by performing an in-situ doping process as the epitaxial growth layer is being formed.

Figure 4:
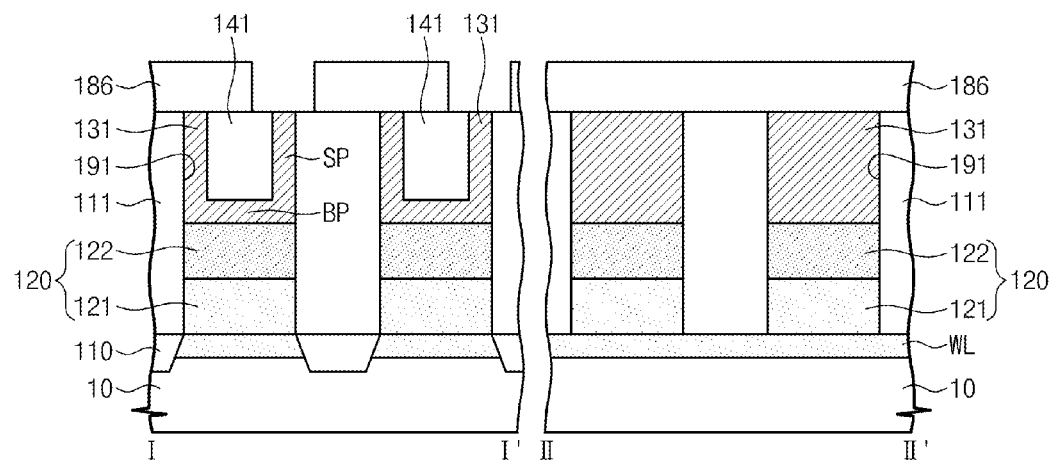

Next, referring to FIGS. 2 and 4, preliminary conductive patterns 131 are formed in the openings 191. The preliminary conductive patterns 131 are formed along the top surfaces of the diodes 120 and the sides of the openings 191. A first buried pattern 141 filling the opening 191 may be formed on each preliminary conductive pattern 131. The preliminary conductive patterns 131 and the first buried patterns 141 may be formed by forming a conductive film and an insulation film on the substrate 10 to such thicknesses that the openings 191 are overfilled, and then planarizing the same until the first interlayer insulating film 111 is exposed. The conductive film and hence, the preliminary conductive patterns, may be formed of at least one layer of material each selected from the group consisting of a transition metal, a conductive transition metal nitride and a conductive ternary nitride. The insulation film and hence, the buried patterns 141, may be formed of at least one layer of material each selected from the group consisting of silicon nitride, silicon oxide and silicon oxynitride. Furthermore, the conductive film and the insulating film may be formed by sputtering or chemical vapor deposition (CVD).

As a result, the preliminary conductive pattern 131 has a bottom portion BP on the diode 120 and a sidewall portion SP extending upwardly from the bottom portion BP along the sides of the opening 191. Alternatively, though, the preliminary conductive patterns 131 may fill the openings 191 completely. That is, in this case, the first buried patterns 141 are omitted. Also, a silicide layer (not shown) may be formed on the diode 120 so as to be located between the diode 120 and the preliminary conductive pattern 131. Such a silicide layer can reduce a contact resistance between the diode 120 and the preliminary conductive pattern 131. The silicide layer may comprise a metal silicide such as a cobalt silicide, a nickel silicide or a titanium silicide.

Also, an electrode protection pattern (not shown) may be formed along the sides of the openings 191 before the preliminary conductive patterns 131. Such an electrode protection pattern may be of the same material as the first buried pattern 141. For example, the electrode protection pattern may be a silicon nitride film. Also, the electrode protection pattern may be formed by a sidewall spacer-forming process.

A mask 186 exposing a portion each of the preliminary conductive patterns 131 is then formed on the substrate. The mask 186 may be a line and space pattern in which the lines and spaces are elongated, i.e., extend longitudinally, in a direction (hereinafter it is referred to as a second direction) parallel to line II-II'. The mask 186 may be a photoresist pattern.

Figure 5:
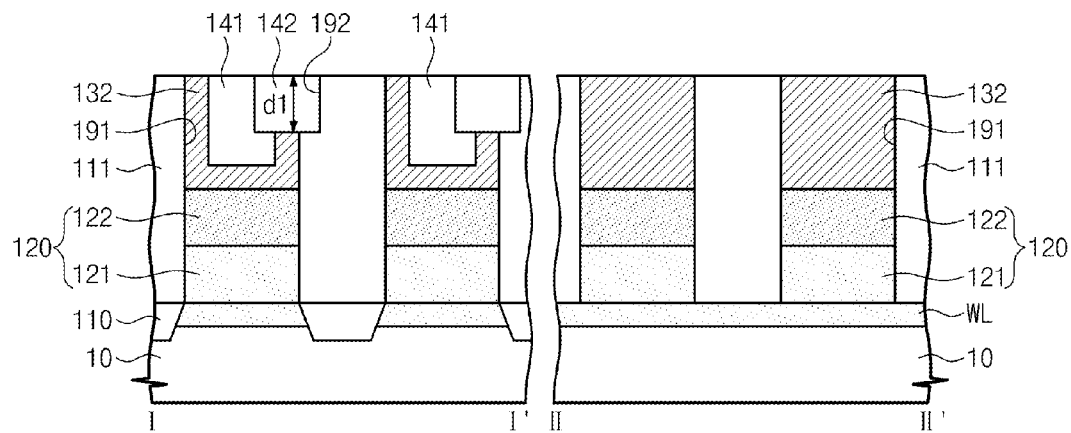

Referring to FIGS. 2 and 5, a first etching process is performed using the mask 186 as an etching mask to remove a portion each of the preliminary conductive patterns 131 and thereby form conductive patterns 132. As a result, first recesses 192 having a predetermined depth (d1) are formed in the structure and, in particular, in the preliminary conductive patterns 131. The first recesses 192 may each have the form of a trench extending longitudinally in the second direction.

Second buried pattern 142 may then be formed in the first recesses 192, respectively. Therefore, the second buried patterns 142 are elongated in the second direction. Also, the second buried patterns 142 may be of the same material as the first buried patterns 141.

As an alternative to the example of the first embodiment illustrated in the drawings, the mask 186 may expose the preliminary conductive patterns 131 while covering the first interlayer insulating film 111 completely. In this case, the preliminary conductive patterns 131 are selectively etched and the first interlayer insulating film 111 is not be etched. Then, the second buried patterns 142 are formed entirely within the regions formed by the openings 191.

Figure 6:
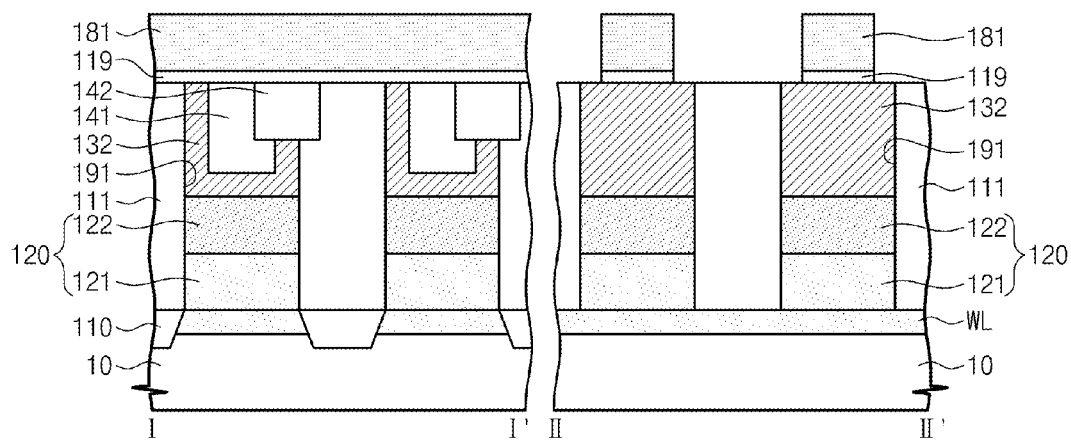

Referring to FIGS. 2 and 6, sacrificial patterns 181 are then formed on the conductive patterns 132. The sacrificial patterns 181 are linear patterns each extending longitudinally in a first direction (I-I' direction) crossing the second direction. The sacrificial patterns 181 are preferably of material having an etching selectivity with respect to mold patterns which will be described later on. Also, in this embodiment, the opposite sidewalls of each sacrificial pattern 181 extend upright on a respective conductive pattern 132.

Furthermore, an etch-stop film 191 may be formed on the conductive patterns 132 before the sacrificial patterns 181 are formed so as to be located between the sacrificial patterns 181 and the conductive patterns 132. The etch-stop film 191 may be a silicon nitride film or a silicon oxynitride film. In this case, the sacrificial patterns 181 may be formed by forming a sacrificial layer on the etch-stop film 119, and then etching the same using a dry etching process or a wet etching process.

Figure 7:
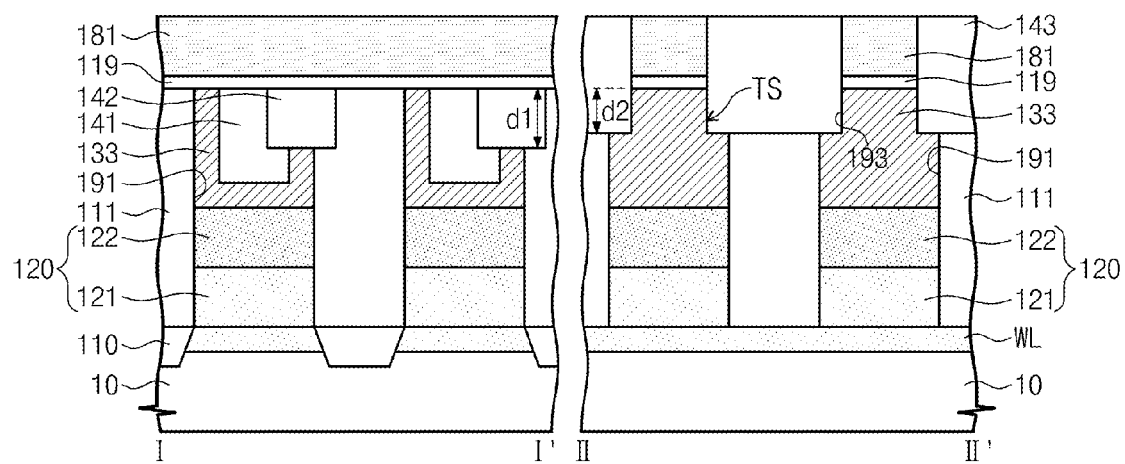

Referring to FIGS. 2 and 7, a second etching process is performed using the sacrificial patterns 181 as an etch-stop mask to remove parts of upper portions of the conductive patterns 132 and thereby form second recesses 193. The second recesses 193 in this example are in the form of trenches extending longitudinally in the first direction.

In particular, according to an aspect of the inventive concept, the upper portion of each conductive pattern 132 is etched at both sides thereof to a predetermined depth (d2). The depth d2 may be different from the depth d1 of the aforementioned recesses 192. The etching process in this case may be a dry etching process or a wet etching process. In the illustrated example, the first interlayer insulating film 111 is also be etched. Alternatively, though, the conductive patterns 132 exposed by the sacrificial patterns 181 may be selectively etched without etching the first interlayer insulating film 111. In this case, the second recesses 193 are limited to the regions of the openings may be limited into the openings 191.

The remaining portions of the conductive patterns 132 constitute lower electrodes 133, respectively. That is, lower electrodes 133 are formed by the second etching process. In this case, upper sidewalls TS of each lower electrode 133 are aligned with opposite sidewalls of a respective sacrificial pattern 181.

Next, mold patterns 143 are formed on the sides of the lower electrodes 133 and the sacrificial patterns 181. The top surfaces of the mold patterns 143 may be flush with the top surfaces of the sacrificial patterns 181. Furthermore, the mold patterns 143 may be formed by forming an insulating layer on the structure in which the second recesses 193 have been formed, and then planarizing the insulating layer to expose the top surfaces of the sacrificial patterns 181.

Also, the mold patterns 143 and the sacrificial patterns 181 are preferably formed of respective materials having an etching selectivity with respect to each other. That is, the sacrificial patterns 181 are preferably formed of material that can be etched with an etch recipe (etchant) that does not significantly etch the mold patterns 143. In particular, the sacrificial pattern 181 are of material that provides an etch selectivity of preferably 1:10 to 1:200 (and more preferably, of 1:30 through 1:100) with respect to the mold patterns 143. Etch selectivity refers to the ratio of the rate at which one material (in this case, the material of the sacrificial patterns 181) will be etched using a give etch recipe to the rate at which another material (in this case, the material of the mold patterns 143)

will be etched using the same etch recipe. Example of the materials which satisfy the etch selectivity include silicon oxide or silicon nitride for the mold patterns 143, and a different material for the mold patterns 143 selected from the group consisting of silicon, silicon oxide, silicon carbide and silicon nitride. As an example of this embodiment, and for ease of description, the mold patterns 143 will be described as being constituted by a silicon oxide film and the sacrificial patterns 181 will be described as being constituted by a silicon nitride film.

Figure 8:
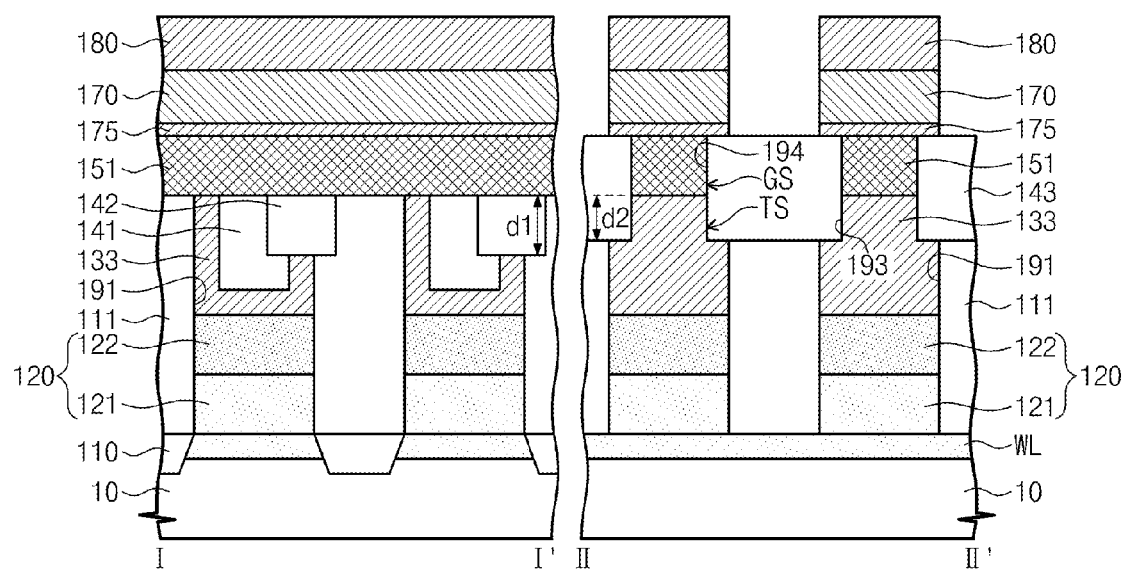

Referring to FIGS. 2 and 8, the sacrificial patterns 181 are then replaced with variable resistance patterns 151.

First, the sacrificial patterns 181 are removed to form third recesses 194. Note, in this embodiment, the third recesses do not expose the first interlayer insulating film 111.

In the case of the example referred to above, the sacrificial patterns 181 can be removed using an etching solution including phosphoric acid. In the case in which the etch stop film 119 is provided, the etch-stop film 119 may be removed when the third recesses 194 are formed or may be removed by an additional etching process such that the top surfaces of the lower electrodes 133 are exposed. In any case, the etch-stop film 119 can prevent the top surface of the lower electrode 133 from being damaged when the sacrificial patterns 181 are removed. The shapes of the third recesses are established by the shapes of the sacrificial patterns 181. In the illustrated example, the third recesses 194 each have the form of a trench extending longitudinally in the first direction.

The third recesses 194 are then filled to form variable resistance patterns 151. At this time, the variable resistance patterns 151 are self-aligned with the lower electrodes 133, respectively. That is, sidewall surfaces GS of each variable resistance pattern 151 are coplanar with upper sidewall surfaces TS of a respective lower electrode 133. Furthermore, as was mentioned at the beginning of the detailed description, each variable resistance pattern 151 is exemplified as a pattern of phase change material. Phase change materials are compounds of at least one of Te and Se, which are chalcogenide elements, and at least one of Ge, Sb, Bi, Pb, Sn, Ag, As, S, Si, P, O and C.

The variable resistance patterns 151 may be formed by forming a variable resistance layer (not shown) on the substrate 10 to such a thickness as to overfill the third recesses 194, and then planarizing the variable resistance layer until the mold patterns 143 are exposed. To summarize, in the embodiment described so far, the variable resistance patterns 151 are formed by a damascene process using a sacrificial layer. Thus, the shapes of the variable resistance patterns 151 correspond to the shapes of the third recesses 194. Specifically, in the illustrated example, each of the variable resistance patterns 151 is a linear pattern extending longitudinally in the first direction atop a respective lower electrode 133.

Next, conductive lines 180 are formed on the variable resistance patterns 151. The conductive lines 180 serve as the bit lines BL in the circuit illustrated by the diagram of FIG. 1. In the illustrated example, the conductive lines 180 extend longitudinally in the first direction. The conductive lines 180 may be formed from a thin metal film. As an example, the conductive lines 180 are formed by forming a thin metal film on the structure by sputtering, and then patterning the metal film.

In addition, upper electrodes 170 may be formed on the variable resistance patterns 151 before the conductive lines 180 are formed, so that upper electrodes 170 are located between the conductive lines 180 and the variable resistance patterns 151 in the device. The upper electrode 170 may be the same material as the lower electrode 133. Furthermore, in this case, the upper electrodes 170 are linear patterns of conductive material extending longitudinally in the first direction together with the conductive lines 180. In another example, an insulating layer is formed on the upper electrodes 170, and the upper electrodes 170 and the conductive lines 180 are connected by forming contact plugs (not shown) in the insulating layer.

A barrier film 175 may also be provided. The barrier film 175 is formed on the variable resistance patterns 151 so as to be located between the upper electrodes 170 and the variable resistance patterns 151 in the device. The barrier film 175 can prevent material from diffusing from one of the variable resistance patterns 151 and the upper electrodes 170 to the other. To this end, the barrier film 175 may include at least one of a metal nitride, a conductive carbon-based material or a metal. As specific examples, the barrier film 175 may comprise at least one layer of material each selected from the group consisting of TiN, WN and TaN.

Figure 9:
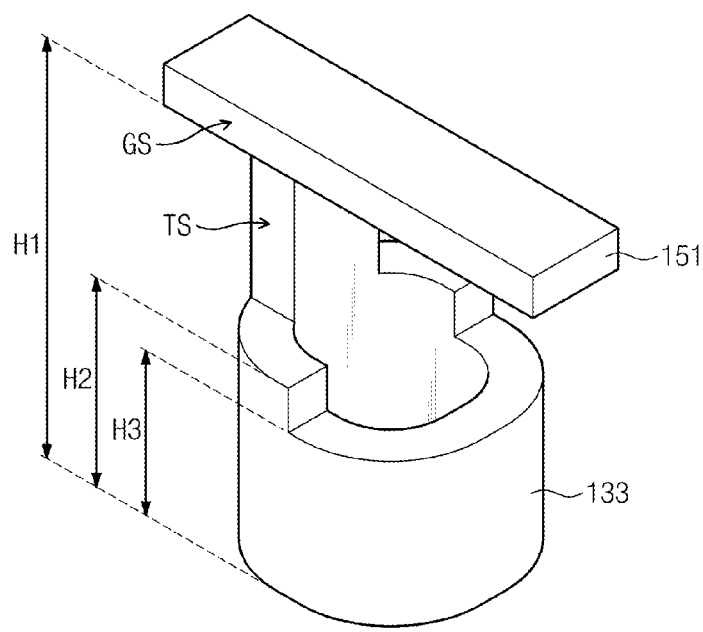
FIGS. 9 and 10 are each a perspective view of the structure of a lower electrode and variable resistance pattern of a variable resistance memory device in accordance with the inventive concept.
Figure 10:
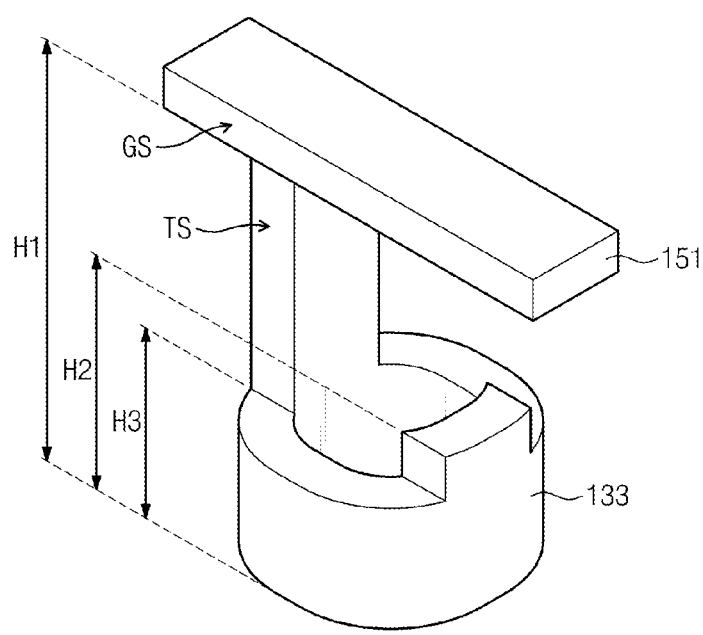

FIGS. 9 and 10 each show the shape of a structure consisting of a lower electrode 133 and the variable resistance pattern 151 disposed thereon. In the embodiment described above, the lower electrode 133 has a sidewall portion and a bottom portion (not visible in this diagram) from which the sidewall portion extends. Furthermore, the variable resistance pattern 151 extends longitudinally in the first direction, and its sidewall surfaces GS are coplanar with sidewall surfaces TS of the lower electrode 133.

FIG. 9 shows the shape of the structure when the depth (d1) to which the first etching process is carried out is greater than the depth (d2) to which the second etching process is carried out. In this case, the sidewall portion of the lower electrode 133 has first, second and third upwardly facing surfaces each located at a respective height or level in the device. The first and uppermost of these surfaces contacts the variable resistance pattern 151 and is located at height (H1), i.e., the overall height of the lower electrode. The portion of the lower electrode 133 which extends up to the bottom of the first recess 192 formed by the first etching process has a height (H3). That is, a third of the upwardly facing surfaces of the lower electrode, delimiting the bottom of the recess 192 formed by the first etching process, is located at height (H3). The portion of the lower electrode 133 which extends up to the bottom of the recess 194 formed by the second etching process has a height (H2). That is, a second of the upwardly facing surfaces of the lower electrode, delimiting the bottom of the recess 194 formed by the second etching process, is located at height (H2). Accordingly, in this example, the height (H2) is greater than the third height (H3).

FIG. 10 shows the shape of the lower electrode 133 that is formed when the depth (d2) to which the second etching process is carried out is greater than the depth (d1) to which first etching process is carried out. In this case, the portion of the lower electrode 133 which extends up to the bottom of the first recess 192 formed by the first etching process has a height (H2), and the portion of the lower electrode 133 which extends up to the bottom of the recess 194 formed by the second etching process has height (H3).

Figure 11:
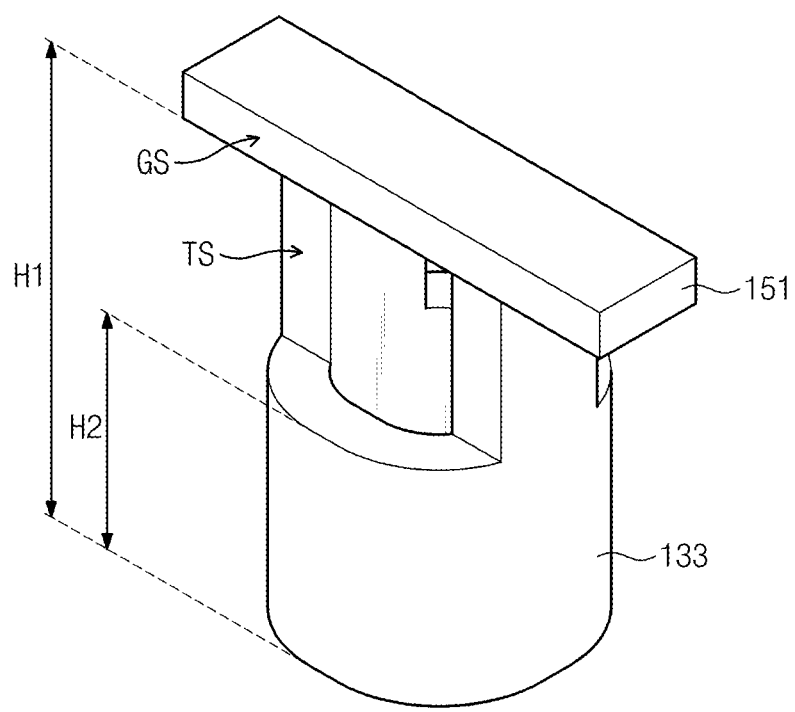
FIG. 11 is a perspective view of still another version of the structure of a lower electrode and variable resistance pattern of a variable resistance memory device in accordance with the inventive concept.

FIG. 11 shows the shape of another structure consisting of a lower electrode 133 and the variable resistance pattern 151 formed thereon. This structure is formed by omitting the first etching process described with reference to FIGS. 4 and 5. That is, the mask 186 (FIG. 4) and the second buried patterns 142 (FIG. 5) are not be formed. Thus, the lower electrode 133 meets the variable resistance pattern 151 at two locations spaced apart from each other along the length of the pattern 151.

With respect to these structures, the area of the top surface of the lower electrode 133, namely the area of the top surface of the sidewall portion of the lower electrode at height (H1) is substantially equal to the area of contact between the lower electrode 133 and the variable resistance pattern 151. In the case in which the variable resistance pattern 151 is of phase change material, the state of the variable resistance pattern 151 is reversibly changed to between an amorphous state and a crystalline state by Joule's heat generated by current flowing through the lower electrode 133. In particular, the Joule's heat generated at an interface between the variable resistance pattern 151 and the lower electrode 133 depends on the resistance at the interface, and the magnitude and duration of the supplying of the current, etc.

According to an embodiment of the inventive concept, the area of contact between the lower electrode 133 and the variable resistance pattern 151 is limited because an upper portion of the preliminary electrode pattern 131 is removed by one or more etching processes to form the lower electrode 133, and the variable resistance pattern 151 is aligned with the remaining upper portion of the lower electrode 133. Therefore, the amount of heat generated at the interface between the lower electrode 133 and the variable resistance pattern 151 is relatively great relative to the key dimensions, e.g., size of the footprint, of the structure.

Thus, the structure has a very high thermal efficiency. Accordingly, the current required to drive the memory cell is minimized.

Moreover, the height (H2) corresponding to the depth (d2) of the second etching process may be designed for to prevent heat from radiating from the interface and the lower portion of the lower electrode 133 (the portion having height H2 and which is out of contact with the variable resistance pattern 151). To this end, the second height (H2) is preferably 40%~60% of the overall height (H1) of the lower electrode 133.

Figure 12:
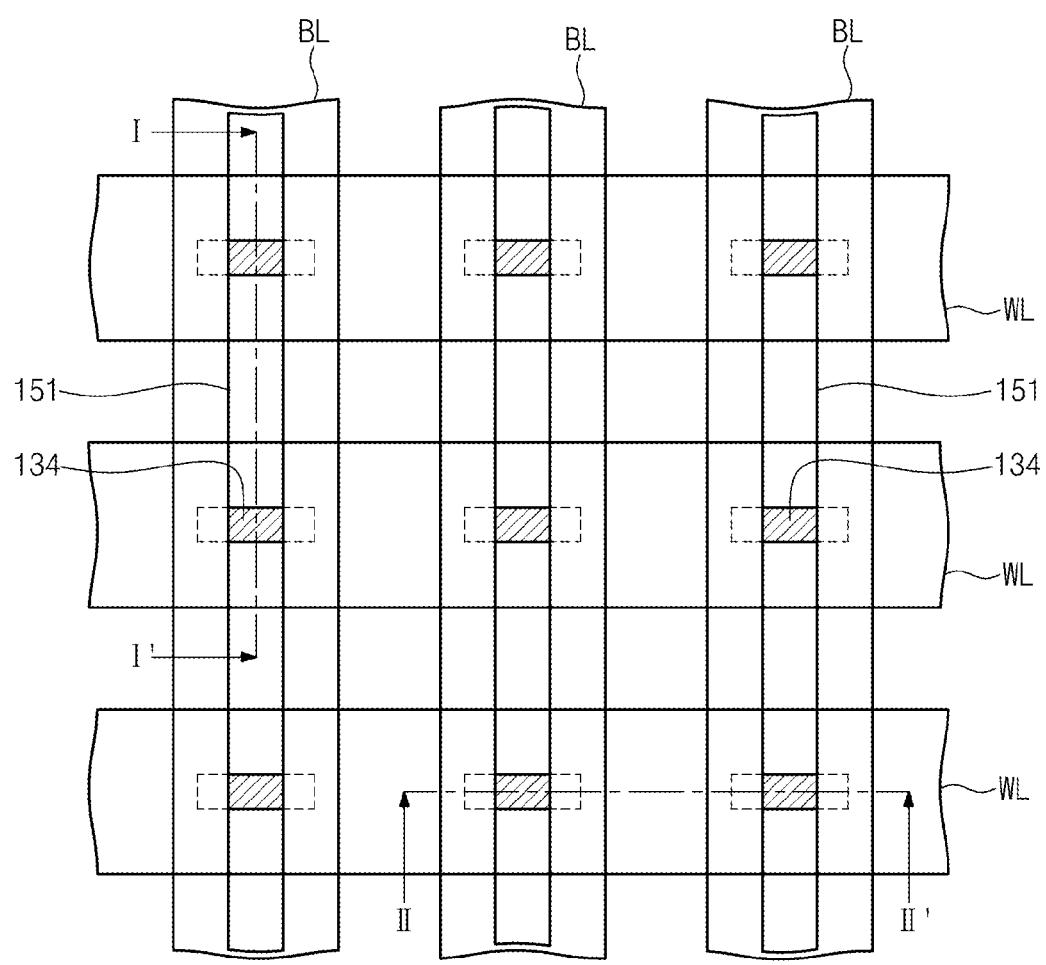
FIG. 12 is a plan view of a cell array of a second embodiment of a variable resistance memory device in accordance with the inventive concept.
Figure 13:
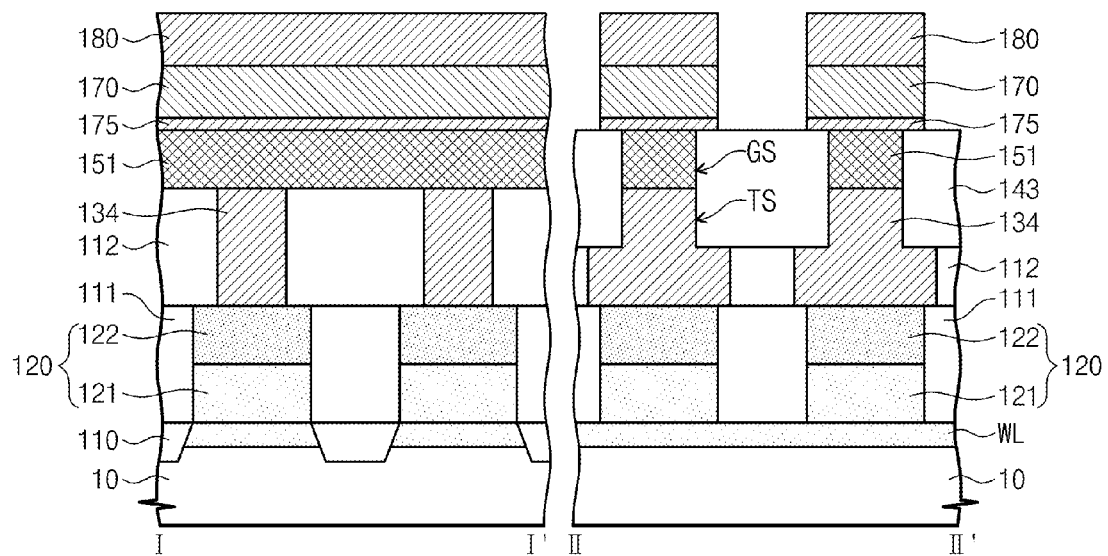
FIG. 13 is a cross-sectional view of the second embodiment of a variable resistance memory device in accordance with the inventive concept, as taken along lines I-I' and II-II' of FIG. 12, and illustrates the manner in which the variable resistance memory device can be manufactured.

A second embodiment of a variable resistance memory device and a method of fabricating the same, according to the inventive concept will now be described with reference to FIGS. 12 and 13. For the sake of brevity, a detailed description of those features/aspects of this embodiment which are similar to those of the first embodiment will be omitted.

In the present embodiment, the lower electrode 134 has the form of a vertically oriented plate. In the illustrated example, the dimension of the lower electrode 134 in the second direction (e.g., its width) is greater than the dimension of the lower electrode 134 (i.e., its thickness) in the first direction. The lower electrodes 134 having this shape can be formed by forming a second interlayer insulating film 112 having openings therethrough on the diodes 120 and then filling the openings with conductive material. Then the second etching process described with reference to FIG. 7 electrodes performed, i.e., the first etching process described with reference to FIGS. 4 and 5 is omitted. As a result, the upper sidewall surfaces TS of each lower electrode 134 are aligned with the sidewall surfaces GS of a respective variable resistance pattern 151, as shown in the figures.

Figure 14:
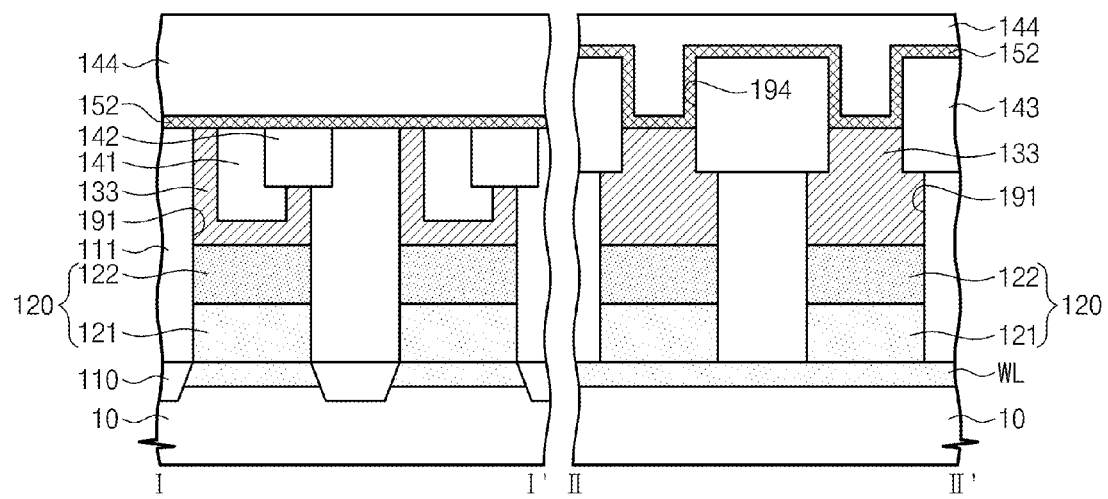
FIGS. 14 and 15 are similar cross-sectional views and together illustrate a method of manufacturing a third embodiment of a variable resistance memory device in accordance with the inventive concept.
Figure 15:
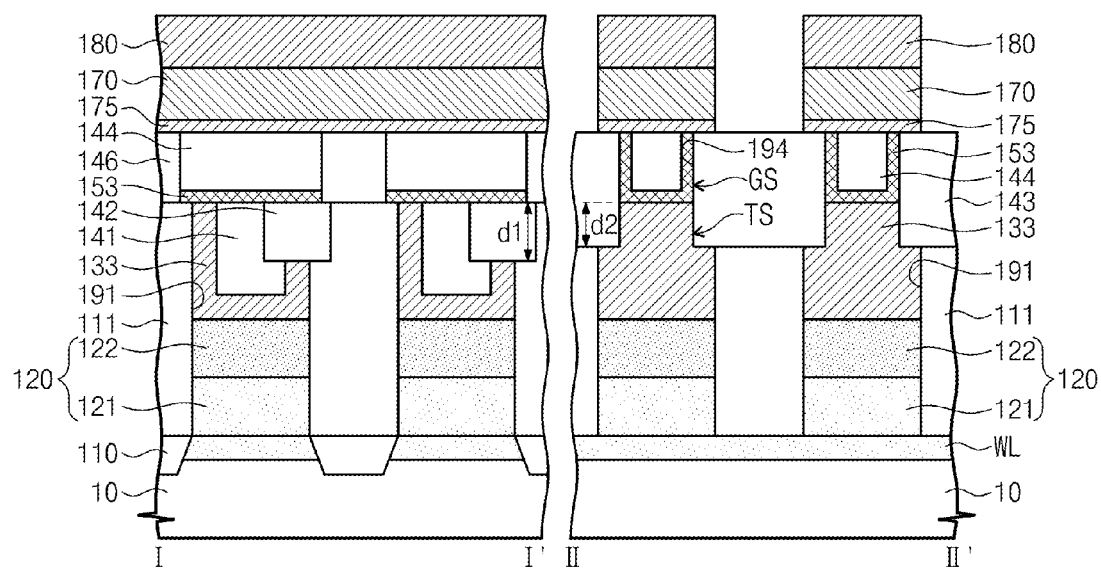

A third embodiment of a variable resistance memory device and a method of manufacturing the same, in accordance with the inventive concept, will now be described with reference to FIGS. 14 and 15. In the third embodiment, a plurality of variable resistance patterns are formed on each lower electrode 133.

First, a structure is formed as described with reference to FIGS. 2-7. Then the sacrificial patterns 181 and the etch-stop film 119 are removed to form third recesses 194. Subsequently, a variable resistance layer is formed conformally on the substrate 10 including in the third recesses 194. A third buried layer 144 is then formed on the variable resistance layer to fill what remains of the third recesses 194. The third buried layer 144 may be a silicon oxide film, a silicon nitride film or a silicon oxynitride film.

Next, the resultant structure is planarized until the mold patterns 143 are exposed. As a result, in this example, the variable resistance layer is divided into a plurality of strips extending longitudinally in the first direction. The strips are then patterned so as to each be divided in the first direction and thereby form resistance patterns 153 on the lower electrodes 133. In this respect, the variable resistance patterns 153 are separated from one another (electrically isolated) in the second direction by the mold patterns 143 and are separated from one another (electrically isolated) in the first direction by a fourth buried layer 146. The fourth buried layer 146 may be a silicon oxide film, a silicon nitride film or a silicon oxynitride film.

Figure 16:
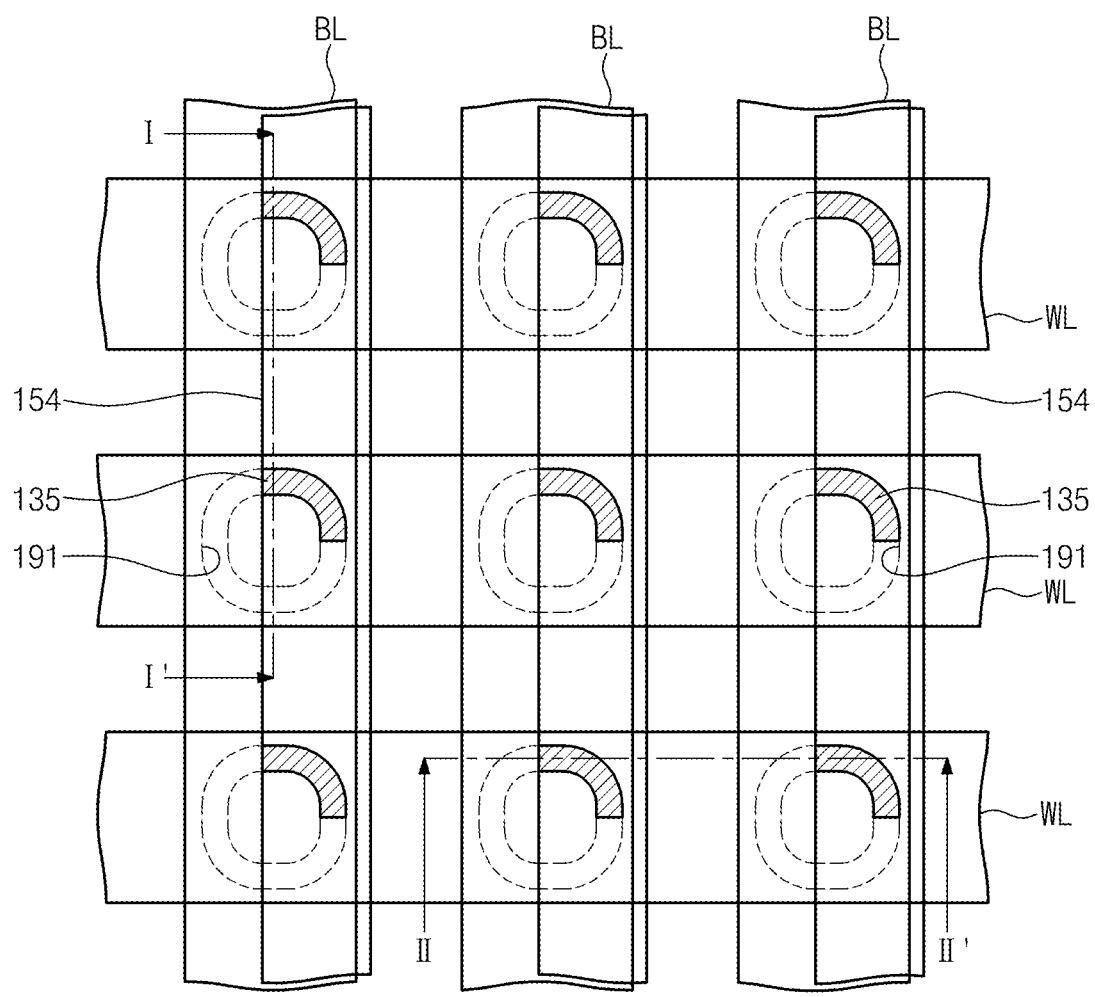
FIG. 16 is a plan view of a cell array of a fourth embodiment of a variable resistance memory device in accordance with the inventive concept.

A fourth embodiment of a variable resistance memory device and a method of manufacturing the same, according to inventive concept, will be described with reference to FIGS. 16 and 17. In the fourth embodiment, only one of the sidewall surfaces of each variable resistance pattern is aligned with a sidewall surface of a respective lower electrode.

Figure 17:
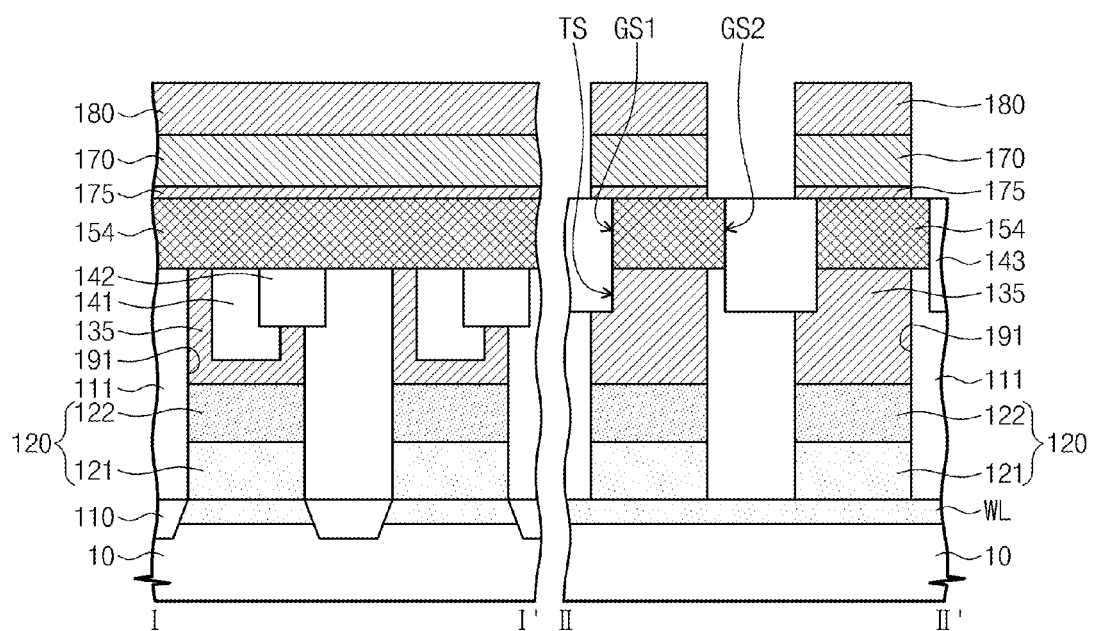
FIG. 17 is a cross-sectional view of the fourth embodiment of a variable resistance memory device in accordance with the inventive concept, as taken along lines I-I' and II-II' of FIG. 16, and illustrates the manner in which the variable resistance memory device can be manufactured.

That is, as best shown in FIG. 17, a first sidewall surface GS1 of each variable resistance pattern 154 is aligned with one upper sidewall surface TS of a respective lower electrode 135 but a second sidewall surface GS2 opposite the first sidewall surface GS1 is not be aligned with the other upper sidewall surface TS of the lower electrode 135. In this case, the second sidewall surface GS2 extends upright on the first interlayer insulating film 111. The shapes of and degree of alignment between the variable resistance patterns 154 and the lower electrodes 135 as described above can be provided by forming the sacrificial patterns (refer to FIG. 6) accordingly.

Figure 18:
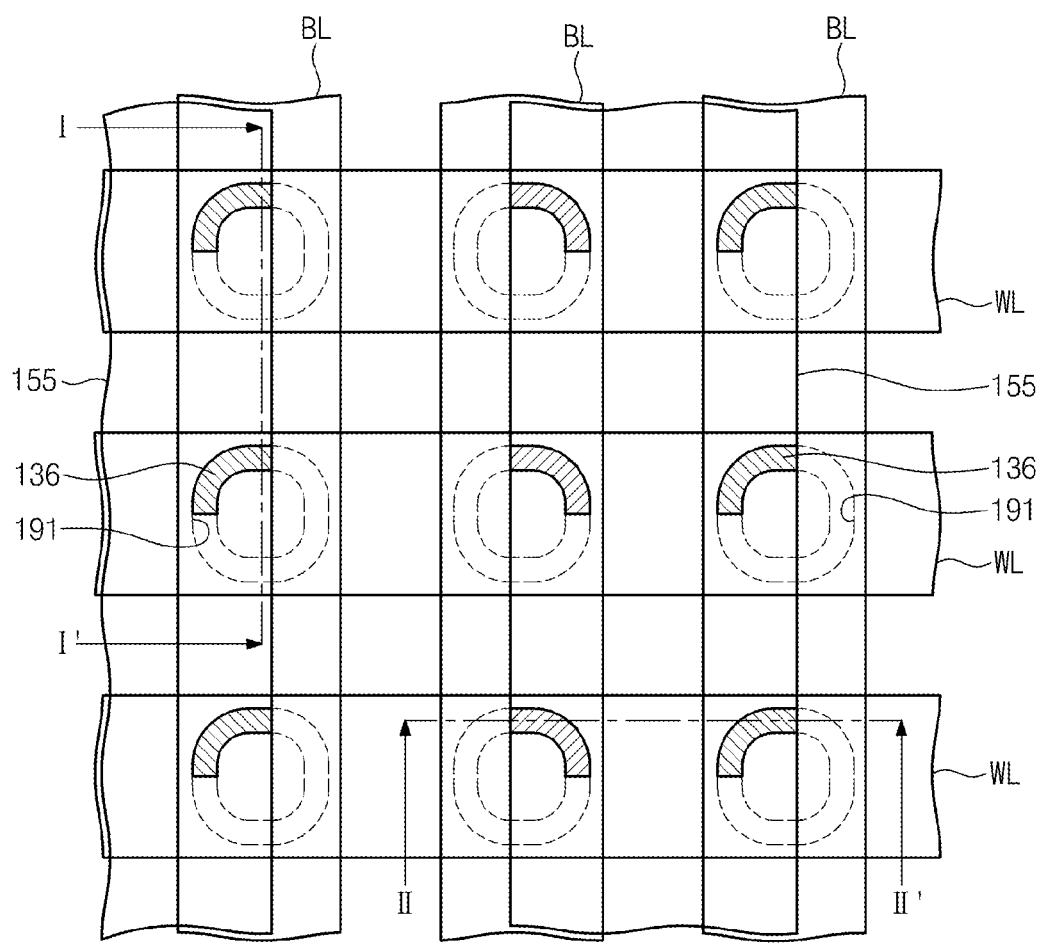
FIG. 18 is a plan view of a cell array of a fifth embodiment of a variable resistance memory device in accordance with the inventive concept.
Figure 19:
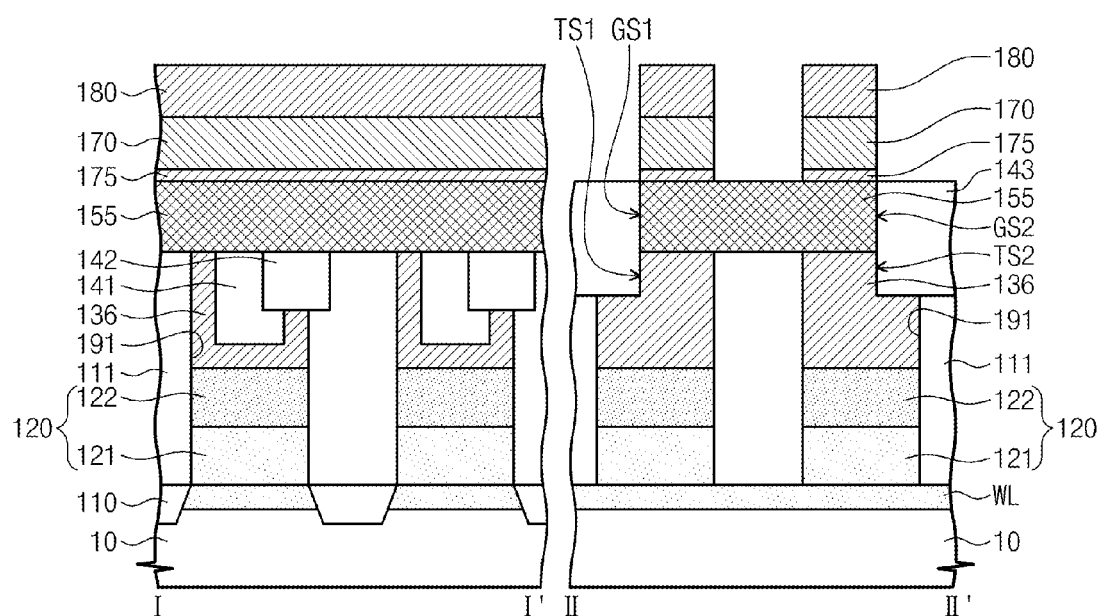
FIG. 19 is a cross-sectional view of the fifth embodiment of a variable resistance memory device in accordance with the inventive concept, as taken along lines I-I' and II-II' of FIG. 18, and illustrates the manner in which the variable resistance memory device can be manufactured.

A fifth embodiment of a variable resistance memory device and a method of manufacturing the same, in accordance with the inventive concept, will now be described with reference to FIGS. 18 and 19.

In this embodiment, each of the variable resistance patterns 155 is connected in common to lower electrodes that are adjacent in the second direction. That is, each variable resistance pattern 155 extends longitudinally in the first direction and covers a plurality of lower electrodes 136 which are adjacent one another in a direction crossing the first direction. In the illustrated example, each of the variable resistance patterns 155 covers two lower electrodes 136 adjacent to each other in the second direction, and the adjacent lower electrodes have mirror symmetry. Furthermore, a first sidewall surface GS1 of the variable resistance pattern 155 is aligned with a sidewall surface TS1 of one of the adjacent lower electrodes, and a second sidewall surface GS2 of the variable resistance pattern 155 is aligned with a sidewall surface TS2 of the other (or another) of the adjacent lower electrodes. Again, as would be clear, the shapes of the variable resistance patterns 155 and the lower electrodes 136 may be established by appropriate design of the widths of the sacrificial patterns described with reference to FIG. 6.

Figure 20:
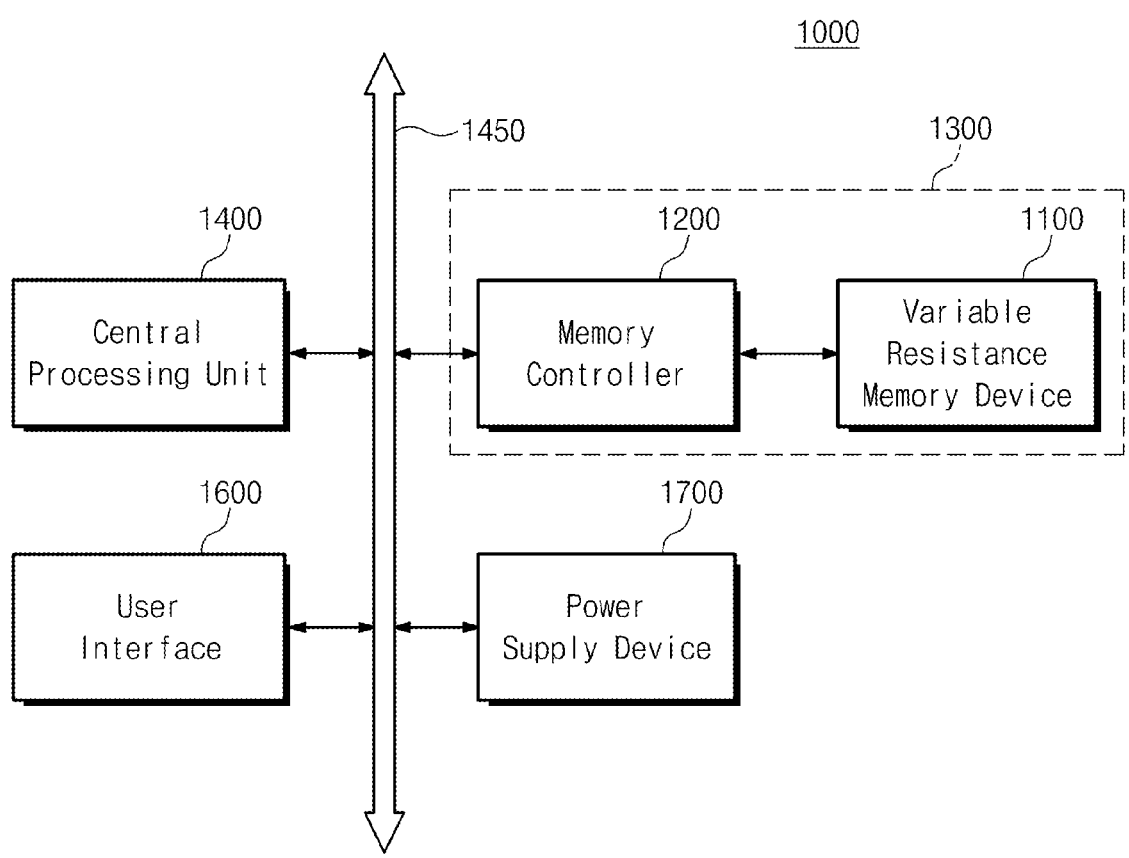
FIG. 20 is a block diagram of a memory system exemplifying an application of variable resistance memory devices in accordance with the inventive concept.

An example of a memory system that may employ a variable resistance memory device in accordance with the inventive concept will be described with reference to FIG. 20.

The memory system 1000 of this example includes a variable resistance memory device 1100 in accordance with the inventive concept, as well as a memory controller 1200, a central processing unit (CPU) 1400, a user interface 1600 and a power supply device 1700 that are electrically connected to a system bus 1450.

Data provided through the user interface 1600 or processed by the central processing unit (CPU) are stored in the variable resistance memory device 1100 through the memory controller 1200. The variable resistance memory device 1100 may constitute a solid state drive (SSD) and in this case, the writing speed of the memory system 1000 is exceedingly high.

Of course, the memory system 1000 may include other components such as an application chipset, a camera image processor (CIS), or a mobile DRAM, etc.

The memory system 1000 may also be employed by a personal digital assistant (PDA), a portable computer, a web tablet, a wireless phone, a mobile phone, a digital music player, or any wireless electronic device that can transmit and/or receive data. Furthermore, the variable resistance memory device 1100 and the memory controller constitute a memory unit 1300 that can take many forms such as a memory card.

Also, a variable resistance memory device or memory unit in accordance with the inventive concept may be packaged in various ways. For example, the variable resistance memory device or memory unit may be assembled as part of a PoP (package on package), ball grid array (BGA) package, chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flatpack (TQFP), system in package (SIP), multi-chip package (MCP), wafer-level fabricated package (WFP), or wafer-level processed stack package (WSP).

According to the inventive concept as described above, a variable resistance memory device according to the inventive concept has a memory cell which operates based on Joule's heat produced by passing current through an electrode of the cell, wherein the memory cell possesses a high degree of thermal efficiency. Thus, according to the inventive concept, a memory cell is provided which can be run on a relatively low amount of driving current. According to another aspect of the inventive concept, as described above, a variable resistance pattern can be formed without being damaged by an etching process.

Finally, embodiments of the inventive concept and examples thereof have been described above in detail. The inventive concept may, however, be embodied in many different forms and should not be construed as being limited to the embodiments described above. Rather, these embodiments were described so that this disclosure is thorough and complete, and fully conveys the inventive concept to those skilled in the art. Thus, the true spirit and scope of the inventive concept is not limited by the embodiment and examples described above but by the following claims.

What is claimed is:

1. A method of manufacturing a variable resistance memory device comprising:
    forming conductive patterns on a substrate;
    forming sacrificial patterns which expose a portion only of the top surface of each of the conductive patterns;
    etching the conductive patterns using the sacrificial patterns as an etching mask to remove part of the upper portion of each of the conductive patterns and thereby form lower electrodes;
    forming mold patterns on the lower electrodes and which cover sidewalls of the sacrificial patterns; and
    replacing the sacrificial patterns with patterns having variable resistance.

2. The method of claim 1, wherein the forming of the lower electrodes and the replacing of the sacrificial patterns with the variable resistance patterns comprise forming each of the variable resistance patterns as self-aligned with and as disposed in contact with an upper portion of a respective one of the lower electrodes, such that sidewall surfaces of each of the variable resistance patterns are aligned with sidewall surfaces of the upper portion of a respective one of the lower electrodes.

3. The method of claim 1, wherein the replacing of the sacrificial patterns with the variable resistance patterns comprises:
    forming first recesses by removing the sacrificial patterns; and
    filling the first recesses with material whose resistance is variable.

4. The method of claim 1, wherein the forming of the conductive patterns comprises:
    forming a first interlayer insulating film having openings therethrough, on the substrate;
    forming preliminary conductive patterns in the openings;
    forming a mask that exposes a portion only of each of the top surfaces of the preliminary conductive patterns; and
    etching the preliminary conductive patterns using the mask as an etching mask.

5. The method of claim 4, wherein the forming of the mask comprises forming linear patterns of material each extending longitudinally in a first direction, and the forming of the sacrificial patterns comprises forming linear patterns of material each extending longitudinally in a second direction that crosses the first direction.

6. The method of claim 4, wherein the etching of the preliminary conductive patterns comprises etching each of the preliminary conductive patterns to a first depth from the top surface thereof,
    the etching of the conductive patterns using the sacrificial patterns as an etching mask comprises etching each of the conductive patterns to a second depth from the top surface thereof, and
    the first depth is different from the second depth.

7. The method of claim 1, wherein the forming of sacrificial patterns comprises forming each of the sacrificial patterns as a linear pattern of material extending longitudinally in a first direction on conductive patterns that adjacent to each other in a second direction crossing the first direction.

8. The method of claim 1, wherein the sacrificial patterns are formed from material having an etching selectivity with respect to the mold patterns.

9. A method of manufacturing a variable resistance memory device comprising:
    forming preliminary conductive patterns on a substrate;
    removing only one part of an upper portion of each of the preliminary conductive patterns and leaving another part of the upper portion of each of the preliminary conductive patterns to thereby form lower electrodes, wherein each of the lower electrodes has a top surface constituted by said another part of the upper portion of one of the preliminary conductive patterns; and
    forming patterns of material, whose resistance varies depending on temperature, on and in contact with the top surfaces of the lower electrodes,
    wherein the top surface of the lower electrodes is substantially equal to the area of contact between the lower electrodes and the variable resistance patterns disposed thereon.

10. The method of claim 9, wherein the removing of one part of an upper portion of each of the preliminary conductive patterns comprises:
- forming a mask that exposes a portion only of each of the top surfaces of the preliminary conductive patterns; and
- etching the preliminary conductive patterns, using the mask as an etching mask, from the top surfaces thereof to a first depth less than the height of the preliminary conductive patterns.

11. The method of claim 10, wherein the mask is a pattern of lines of material extending longitudinally in one direction, and the removing of one part of an upper portion of each of the preliminary conductive patterns further comprises:
- after the preliminary conductive patterns have been etched using the mask as an etching mask, forming on the substrate a second pattern of lines of material extending longitudinally in a direction crossing said one direction, and
- etching the preliminary conductive patterns from the top surfaces thereof to a second depth less than the height of the preliminary conductive patterns and different from the second depth, using the second pattern as an etch mask.

12. The method of claim 9, wherein the lower electrodes are formed by removing material from the upper portions of the preliminary conductive patterns over a height that is 40-60% of the total height of the preliminary conductive patterns.

13. The method of claim 9, wherein each of the patterns of material of variable resistance are formed by an alignment technique such that at least one sidewall surface thereof is aligned with a sidewall surface of one of the lower electrodes.

* * * * *